(12) United States Patent
Kim et al.

(10) Patent No.: US 9,123,630 B2
(45) Date of Patent: Sep. 1, 2015

(54) STACKED DIE PACKAGE, SYSTEM INCLUDING THE SAME, AND METHOD OF MANUFACTURING THE SAME

(71) Applicant: Samsung Electronics Co., Ltd., Suwon-si (KR)

(72) Inventors: Jeong Kyoum Kim, Seoul (KR); Jung Hwan Choi, Hwaseong-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/094,952

(22) Filed: Dec. 3, 2013

(65) Prior Publication Data

US 2014/0203457 A1    Jul. 24, 2014

(30) Foreign Application Priority Data

Jan. 24, 2013   (KR) .................... 10-2013-0007765

(51) Int. Cl.
   *H01L 23/02*    (2006.01)
   *H01L 25/18*    (2006.01)
   *H01L 25/065*   (2006.01)
   *H01L 23/498*   (2006.01)

(52) U.S. Cl.
   CPC ............ *H01L 25/18* (2013.01); *H01L 25/0652* (2013.01); *H01L 25/0657* (2013.01); *H01L 23/49816* (2013.01); *H01L 2224/16225* (2013.01); *H01L 2225/06517* (2013.01); *H01L 2225/06527* (2013.01); *H01L 2225/06562* (2013.01); *H01L 2924/1301* (2013.01); *H01L 2924/15311* (2013.01)

(58) Field of Classification Search
   USPC .................... 257/686, 777, 778, 723, 724
   See application file for complete search history.

(56) References Cited

U.S. PATENT DOCUMENTS

| | | | |
|---|---|---|---|
| 6,731,009 B1 * | 5/2004 | Jones et al. .................... | 257/777 |
| 6,740,980 B2 * | 5/2004 | Hirose .......................... | 257/777 |
| 7,518,224 B2 * | 4/2009 | Shim et al. .................... | 257/686 |
| 7,550,835 B2 | 6/2009 | Kang | |
| 7,576,434 B2 | 8/2009 | Mancera et al. | |
| 8,383,458 B2 * | 2/2013 | Choi et al. .................... | 438/109 |
| 8,698,300 B2 * | 4/2014 | Ko ............................... | 257/686 |
| 2004/0021230 A1 * | 2/2004 | Tsai et al. ...................... | 257/777 |
| 2004/0026789 A1 * | 2/2004 | Michii .......................... | 257/777 |
| 2004/0124539 A1 | 7/2004 | Yang et al. | |
| 2008/0150111 A1 * | 6/2008 | Hiller et al. ................... | 257/686 |
| 2008/0157322 A1 | 7/2008 | Tang et al. | |
| 2008/0246162 A1 | 10/2008 | Kwon et al. | |
| 2009/0302483 A1 | 12/2009 | Lin et al. | |
| 2010/0244278 A1 | 9/2010 | Shen | |
| 2010/0314740 A1 * | 12/2010 | Choi et al. .................... | 257/686 |
| 2011/0033978 A1 | 2/2011 | Oh | |
| 2011/0045636 A1 | 2/2011 | Chung | |
| 2011/0095424 A1 | 4/2011 | Song et al. | |
| 2011/0215472 A1 | 9/2011 | Chandrasekaran | |
| 2011/0227207 A1 | 9/2011 | Yilmaz et al. | |

* cited by examiner

*Primary Examiner* — S. V. Clark
(74) *Attorney, Agent, or Firm* — Muir Patent Law, PLLC

(57) ABSTRACT

A stacked die package includes a package substrate, a first die mounted on the package substrate and electrically connected to the package substrate, a second die electrically connected to the package substrate, and an interposer mounted on the package substrate and including a plurality of vertical electrical connection means electrically connecting the package substrate to the second die. At least part of the first die is disposed between the second die and the package substrate in a vertical direction.

15 Claims, 22 Drawing Sheets

STACKED DIE PACKAGE, SYSTEM INCLUDING THE SAME, AND METHOD OF MANUFACTURING THE SAME

CROSS-REFERENCE TO RELATED APPLICATION

This application claims priority under 35 U.S.C. §119(a) to Korean Patent Application No. 10-2013-0007765 filed on Jan. 24, 2013, the disclosure of which is hereby incorporated by reference in its entirety.

BACKGROUND

This disclosure relates to circuit packaging, and more particularly, to a stacked die package for reducing die packaging cost, a system including the same, and a method of manufacturing the same.

A semiconductor wafer includes several hundred or thousand chips on which the same electrical circuit is printed. The chips cannot communicate with external devices by themselves. Accordingly, electrical wiring is connected to a chip to enable the chip to communicate with external devices and they are hermetically packaged in a semiconductor packaging process so as to endure external impact such as physical impact or chemical impact. The semiconductor packaging process, also known as a die packaging process, is often one of the last steps in the semiconductor manufacturing processes.

When a plurality of dies are stacked on a package substrate using wire bonding, each of the dies includes a redistribution layer (RDL) which connects a center pad with an edge pad. When the distance between the center pad and the edge pad increases, the capacitance and the resistance of the dies also increase. In addition, since an RDL process is added, packaging cost increases.

When dies are stacked on a package substrate using a through-silicon via (TSV), a process of forming the TSV in the dies may be required, resulting in an increase in the packaging cost.

SUMMARY

According to one embodiment, a stacked chip package includes: a package substrate; at least a first chip stacked on the package substrate at a first height above the package substrate and electrically connected to the package substrate; and at least a second chip stacked on the package substrate at a second height above the first height and electrically connected to the package substrate, part of the second chip overlapping part of the first chip in a vertical direction and part of the second chip not overlapping the first chip in the vertical direction.

Both the first chip and the second chip may be flip chips electrically connected to the package substrate using a flip chip configuration. For example, the first chip may be electrically connected to the package substrate using a direct flip chip connection; and the second chip may be electrically connected to the package substrate using a flip chip connection to an interposer disposed between the second chip and the package substrate. The interposer may include a plurality of vertical electrical connection means electrically connecting the second chip to the package substrate.

In one embodiment, at least a third chip is stacked on the package substrate at the first height and is horizontally separate from the first chip, such that part of the second chip overlaps part of the third chip in a vertical direction and part of the second chip does not overlap the third chip in the vertical direction. Each of the first chip and third chip, may be flip chips electrically connected to the package substrate using a flip chip configuration. In addition, each of the first chip and the third chip may be directly electrically connected to the package substrate; and the second chip may be electrically connected to the package substrate through an interposer.

In one embodiment, the stacked chips on the package substrate include: k levels of chips, each level including one or more chips disposed at a same height above the package substrate, wherein k is an integer being 2 or more; n chips disposed at a first level corresponding to the first height, wherein n is an integer being 3 or more; and m chips disposed at a second level corresponding to the second height wherein m is an integer greater than 0 and less than n. In addition, p chips may be disposed at the kth level of chips, p being less than n; and a vertical height between a bottom of the n chips disposed at the first level and a top of the p chips disposed at the kth level may be less than a cumulative vertical height of each of the chips of the stacked chips combined. For example, in one embodiment, the vertical height between the bottom of the n chips disposed at the first level and a top of the p chips disposed at the kth level is less than ⅔ the cumulative vertical height of each of the chips of the stacked chips combined.

In one embodiment, one of the first chip and the second chip is a memory chip, and the other of the first chip and the second chip is a memory chip or a memory controller.

In another embodiment, a stacked chip package includes: a package substrate; at least a first chip stacked on the package substrate at a first height above the package substrate and electrically connected to the package substrate; at least a second chip stacked on the package substrate at the first height and electrically connected to the package substrate; and at least a third chip stacked on the package substrate at a second height above the first height and electrically connected to the package substrate, part of the third chip overlapping part of the first chip in a vertical direction, part of the third chip overlapping part of the second chip in a vertical direction, and part of the third chip not overlapping the first chip and not overlapping the second chip in the vertical direction.

An interposer may be disposed between the package substrate and the third chip. In one embodiment, the first chip is directly electrically connected to the package substrate; the second chip is directly electrically connected to the package substrate; and the third chip is electrically connected to the package substrate through the interposer. At least one of the first chip and the second chip may be directly electrically connected to the package substrate in a flip chip configuration.

In one embodiment, the stacked chips on the package substrate include: k levels of chips, each level including one or more chips disposed at a same height above the package substrate, wherein k is an integer being 2 or more; n chips disposed at a first level corresponding to the first height, wherein n is an integer being 3 or more; and m chips disposed at a second level corresponding to the second height wherein m is an integer greater than 0 and less than n. In addition, p chips may be disposed at the kth level of chips, and a vertical height between a bottom of the n chips disposed at the first level and a top of the p chips disposed at the kth level is less than ⅔ the cumulative vertical height of each of the chips of the stacked chips combined. For example, the vertical height between the bottom of the n chips disposed at the first level and a top of the p chips disposed at the kth level may be less than ½ the cumulative vertical height of each of the chips of the stacked chips combined.

In one embodiment, a stacked die package includes: a package substrate; a first die mounted on the package substrate and electrically connected to the package substrate; a second die electrically connected to the package substrate; and an interposer mounted on the package substrate and including a plurality of vertical electrical connection means electrically connecting the package substrate to the second die. At least part of the first die is disposed between the second die and the package substrate in a vertical direction.

The vertical electrical connection means each may be a through-silicon via.

The first die and the second die may each be a flip-chip. Furthermore, one of the first die and the second die may be a memory device, and the other of the first die and the second die may be a memory device or a memory controller.

DETAILED DESCRIPTION

Figure 1:
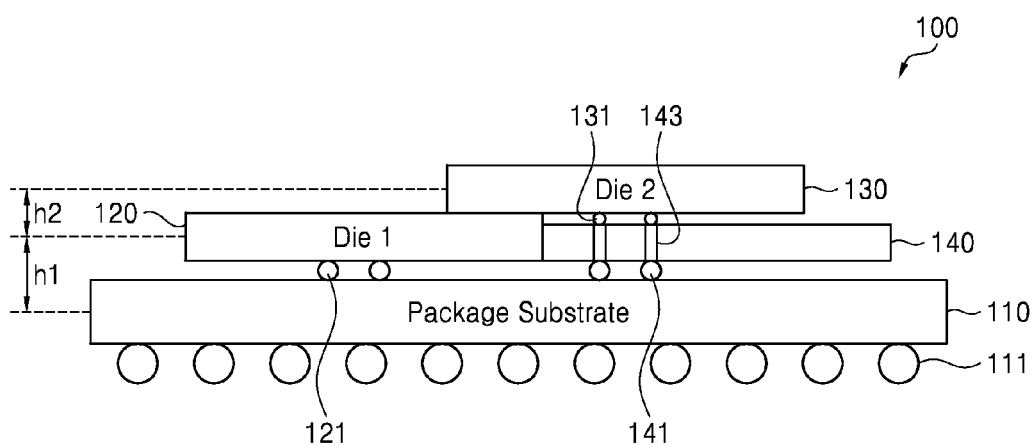
FIG. 1 is a cross-sectional view of a stacked die package according to some exemplary embodiments.

The present disclosure now will be described more fully hereinafter with reference to the accompanying drawings, in which various embodiments are shown. The invention may, however, be embodied in many different forms and should not be construed as limited to the embodiments set forth herein. In the drawings, the size and relative sizes of layers and regions may be exaggerated for clarity. Like numbers refer to like elements throughout.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. Unless indicated otherwise, these terms are only used to distinguish one element from another. For example, a chip described as a first chip in the detailed description could be termed a second chip in a claim, and, similarly, a chip described as a second chip in the detailed description could be termed a first chip in a claim, without departing from the teachings of the disclosure. In addition, though some items in the detailed description are not labeled as "first" or "second" elements, etc., they may be claimed as such to distinguish one element from another.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Embodiments described herein will be described referring to plan views and/or cross-sectional views by way of ideal schematic views. Accordingly, the exemplary views may be modified depending on manufacturing technologies and/or tolerances. Therefore, the disclosed embodiments are not limited to those shown in the views, but include modifications in configuration formed on the basis of manufacturing processes. Therefore, regions exemplified in figures have schematic properties, and shapes of regions shown in figures exemplify specific shapes of regions of elements, and the specific properties and shapes do not limit aspects of the invention.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Figure 2:
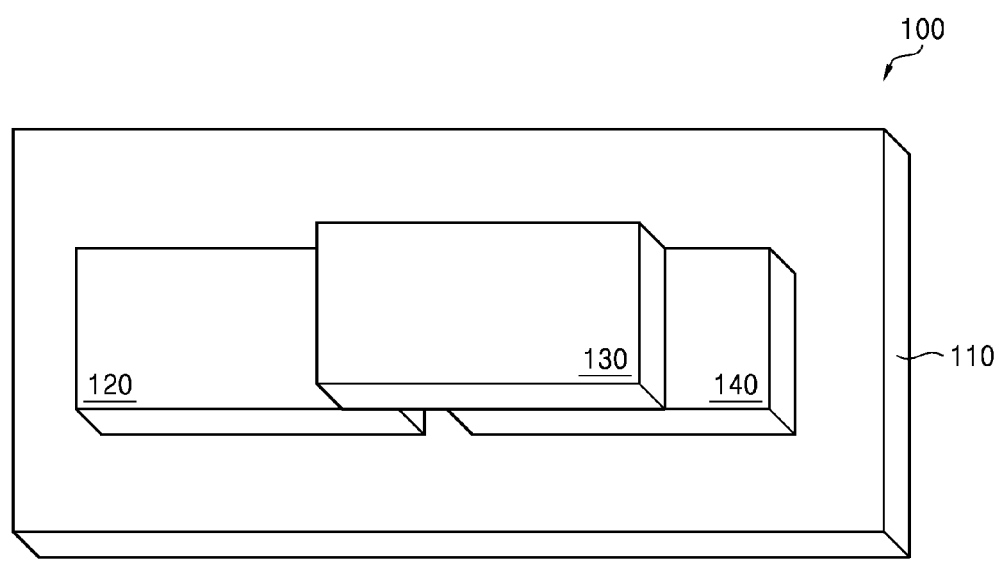
FIG. 2 is an exemplary top view of the stacked die package illustrated in FIG. 1.

FIG. 1 is a cross-sectional view of a stacked die package 100 according to some exemplary embodiments. FIG. 2 is an exemplary top view of the stacked die package 100 illustrated in FIG. 1.

Referring to FIGS. 1 and 2, the stacked die package 100 includes a package substrate 110, a first die 120, a second die 130, and an interposer 140. The package substrate 110 may be referred to as a printed circuit board (PCB). A plurality of solder balls 111 are used to attach the package substrate 110 to a system board (not shown) or an external device. The solder balls 111 may be replaced with a ball grid array (BGA) or lead frames.

The first die 120 and the second die 130 each may be implemented in flip-chip form. The first die 120 and the interposer 140 are mounted on the top of the package substrate 110. A plurality of bumps 121 are used to attach the first die 120 to the package substrate 110. A plurality of bumps 141 are used to attach the interposer 140 to the package substrate 110.

The interposer 140 may be a dummy die. For example, in one embodiment, the interposer 140 does not include a functional circuit. The interposer 140 may be referred to as a dummy PCB. The interposer 140 includes vertical electrical connection means 143 to electrically connect the package substrate 110 with the second die 130. The vertical electrical connection means 143 each may be, for example, a through substrate via, such as a through silicon via (TSV).

Since the interposer 140 is used, the first die 120 does not need a vertical electrical connection means for the stack of the first and second dies 120 and 130. As such, the first die 120 does not include the vertical electrical connection means. As shown, the first die 120 and second die 130 also do not include wire bonding to connect to the package substrate 110.

Since the dies 120 and 130 are implemented in the flip-chip form, the capacitance and resistance of the dies 120 and 130, which may be caused by a redistribution layer (RDL), are reduced.

The second die 130 is mounted on the first die 120 and the interposer 140. A plurality of bumps, such as microbumps 131 electrically connect the second die 130 with the package substrate 110 through the vertical electrical connection means 143. The second die 130 partially overlaps the first die 120 and also partially overlaps the interposer 140. As shown in FIGS. 1 and 2, the first die 120 is directly electrically connected to the package substrate 110, by a direct flip chip connection, and the second die 130 is indirectly electrically connected to the package substrate 110 through interposer 140 (e.g. by a flip chip connection between the second die 130 and the interposer 140).

The first and second dies 120 and 130 each may be referred to as a chip or an integrated circuit (IC). The first and second dies 120 and 130 each include functional circuits including a memory cell array which stores data and an access control circuit which accesses the memory cell array.

The first and second dies 120 and 130 each may be implemented, for example, as a volatile memory device such as dynamic random access memory (DRAM), static RAM (SRAM), Rambus DRAM (RDRAM), thyristor RAM (T-RAM), zero-capacitor RAM (Z-RAM), or twin transistor RAM (TTRAM).

Alternatively, the first and second dies 120 and 130 each may be implemented as a non-volatile memory device such as electrically erasable programmable read-only memory (EEPROM), flash memory, magnetic RAM (MRAM), spin-transfer torque MRAM (STT-MRAM), conductive bridging RAM (CBRAM), ferroelectric RAM (FeRAM), phase-change RAM (PRAM), resistive RAM (RRAM), nanotube RRAM, polymer RAM (PoRAM), nano floating gate memory (NFGM), holographic memory, molecular electronic memory device, or insulator resistance change memory. As another alternative, one of the first and second dies 120 and 130 may be a memory controller while the other is a memory device.

The stacked die package 100 may be implemented as a ball grid array (BGA), a chip scale package (CSP), a plastic leaded chip carrier (PLCC), a plastic dual in-line package (PDIP), a chip on board (COB), a ceramic dual in-line package (CERDIP), a plastic metric quad flat pack (MQFP), a thin quad flat pack (TQFP), a small outline integrated circuit (SOIC), a shrink small outline package (SSOP), a thins small outline package (TSOP), a system in package (SIP), a multi chip package (MCP), a wafer-level package (WLP), or a wafer-level processed stack package (WSP).

As shown in FIG. 1, the first die 120 may be stacked on the package substrate 110 at a first height (e.g., h1) above the package substrate, and the second die 130 may be stacked on the package substrate 110 at a second height (e.g., h2) above the first height. Though the heights h1 and h2 are shown using a center of package substrate 110, first die 120, and second die 130, as reference points these are exemplary depictions. The height difference between different levels in the stack package can be considered from different reference points. As shown, in one embodiment, the first die 120 is entirely disposed above a top surface of the package substrate 110. Also as shown, the second die 130 may be entirely disposed above a top surface of the first die 120.

Figure 3:
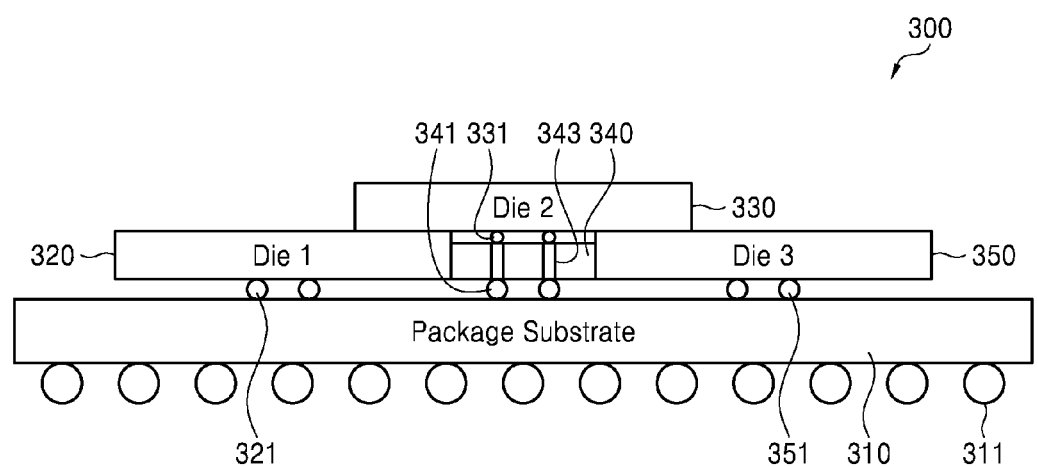
FIG. 3 is a cross-sectional view of a stacked die package according to other exemplary embodiments.

FIG. 3 is a cross-sectional view of a stacked die package 300 according to other exemplary embodiments. Referring to FIG. 3, the stacked die package 300 includes a package substrate 310, a plurality of dies 320, 330, and 350, and an interposer 340.

A plurality of solder balls 311 are used to attach the package substrate 310 to a system board (not shown) or an external device. The dies 320 and 350 and the interposer 340 are mounted on the package substrate 310. A plurality of bumps 321, 341, and 351 are respectively used to attach the dies 320 and 350 and the interposer 340 to the package substrate 310.

The second die 330 is mounted on the first die 320, the interposer 340, and the third die 350. The interposer 340 includes vertical electrical connection means 343 to electrically connect the package substrate 310 with the second die 330. A plurality of bumps, such as microbumps 331 electrically connect the second die 330 with the package substrate 310 through the vertical electrical connection means 343. The functions of the elements 320, 330, 340, and 350 of the stacked die package 300 are similar to those of the elements 120, 130, and 140 of the stacked die package 100 illustrated in FIG. 1. Thus, detailed descriptions thereof will be omitted.

As can be seen in FIG. 3, as a result of the stacking arrangement, while three dies (e.g., three chips) are included in the stack on a single package substrate, the vertical height of the stack is less than the total cumulative vertical height of the three dies taken separately. As such, the cumulative vertical height of the individual dies of the stacked chips combined is greater than the height of the stack including the individual dies (e.g., as shown in the example of FIG. 3, the height of the stack may be about ⅔ the height of the combined heights of the individual dies).

Figure 4:
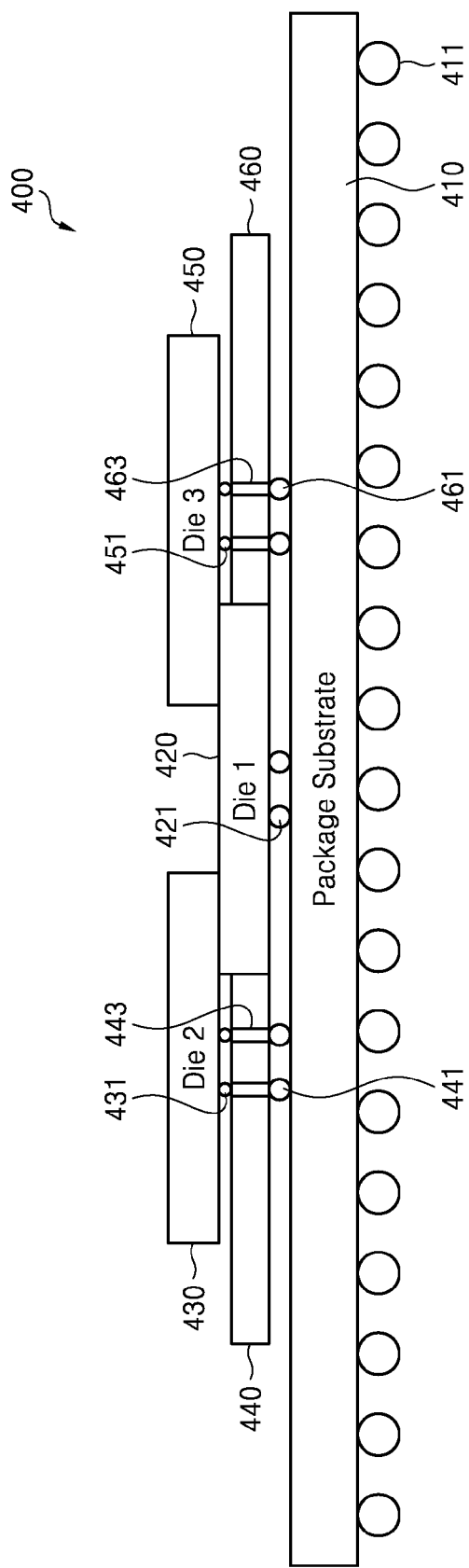
FIG. 4 is a cross-sectional view of a stacked die package according to further exemplary embodiments.

FIG. 4 is a cross-sectional view of a stacked die package 400 according to further exemplary embodiments. Referring to FIG. 4, a stacked die package 400 includes a package substrate 410, a plurality of dies 420, 430, and 450, and a plurality of interposers 440 and 460.

The first die 420 and the interposers 440 and 460 are mounted on the package substrate 410. The second die 430 is mounted on the first interposer 440 and the first die 420. The first interposer 440 includes first vertical electrical connection means 443 to electrically connect the package substrate 410 with the second die 430. The third die 450 is mounted on the first die 420 and the second interposer 460. The second interposer 460 includes second vertical electrical connection means 463 to electrically connect the package substrate 410 with the third die 450.

The functions of the elements 410, 411, 420, 421, 430, 431, 440, 441, 443, 450, 451, 460, 461, and 463 of the stacked die package 400 are similar to those of the elements 110, 111, 120, 121, 130, 131, 140, 141, and 143 of the stacked die package 100 illustrated in FIG. 1. Thus, detailed descriptions thereof will be omitted.

Figure 5:
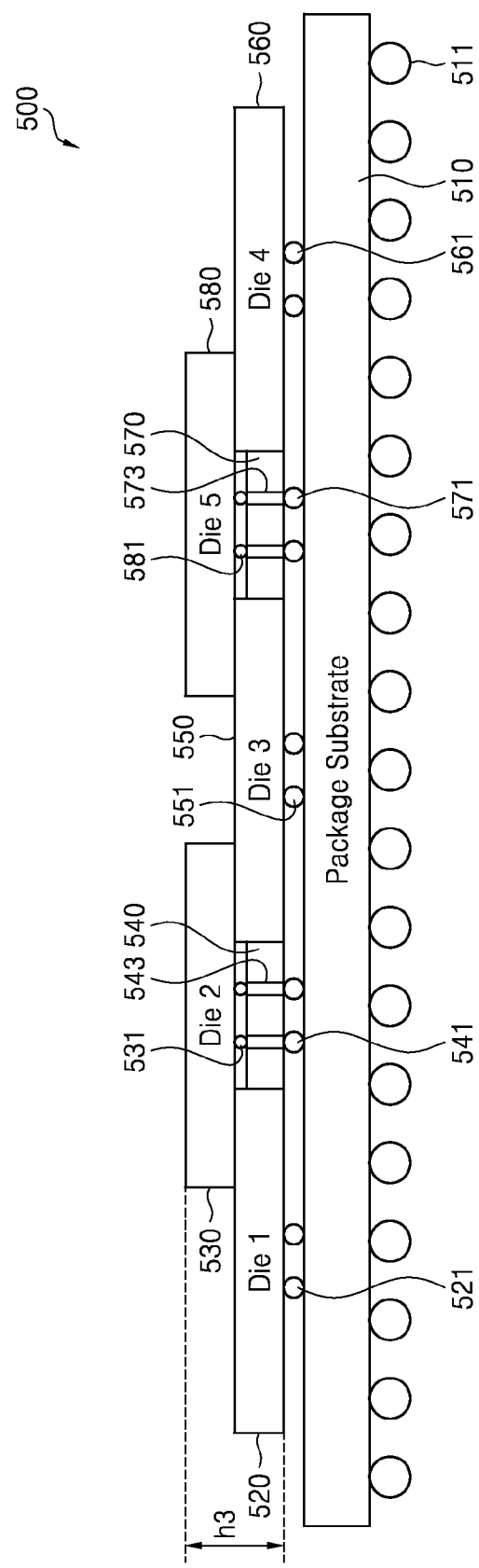
FIG. 5 is a cross-sectional view of a stacked die package according to other exemplary embodiments.

FIG. 5 is a cross-sectional view of a stacked die package 500 according to other exemplary embodiments. Referring to FIG. 5, a stacked die package 500 includes a package substrate 510, a plurality of dies 520, 530, 550, 560, and 580, and a plurality of interposers 540 and 570.

The dies 520, 550, and 560 and the interposers 540 and 570 are mounted on the package substrate 510, for example at a first level. The second die 530 is mounted on the first die 520, the first interposer 540, and the third die 550. The first interposer 540 includes first vertical electrical connection means 543 to electrically connect the package substrate 510 with the second die 530.

The fifth die 580 is mounted on the third die 550, the second interposer 570, and the fourth die 560. The second interposer 570 includes second vertical electrical connection means 573 to electrically connect the package substrate 510 with the fifth die 580. The second die 530 and fifth die 580 may therefore be disposed at a second level higher above the package substrate 510 than the first level. As shown in FIG. 5, in one embodiment, five dies are included in the die stack, and the die stack has 2 levels. As shown, a vertical height (e.g., h3) between a bottom of the three first level dies and a top of the two second level dies is less than a cumulative vertical height of the five dies of the die stack combined. For example, the height h3 may be approximately two times the height of one of the dies, while the combined height of the five dies may be five times the height of one of the dies. As a result, the height h3 may be less than half of the height of the combined height of the five dies.

The functions of the elements 510, 511, 520, 521, 530, 531, 540, 541, 543, 550, 551, 560, 561, 570, 571, 573, 580, and 581 of the stacked die package 500 are similar to those of the elements 110, 111, 120, 121, 130, 131, 140, 141, and 143 of the stacked die package 100 illustrated in FIG. 1. Thus, detailed descriptions thereof will be omitted.

Also, though five total dies, which may be chips, are shown, and two levels of dies are included in the die stack, with three dies at the bottom level and two dies at the top level, these numbers may vary, as will be described further below. For example, there may be j total dies (five, in the example of FIG. 5) stacked using k levels (two, in the example of FIG. 5) of dies, each level including one or more dies disposed at a same height above the package substrate. There may be n dies (three, in the example of FIG. 5) disposed at the first level, and m dies (two, in the example of FIG. 5) disposed at the second level, which m dies can be a smaller number of dies than the n dies at the first level. There may be additional levels as well. The top level, or kth level, may include a certain number of chips, which may be referred to herein as p chips. In the example of FIG. 5, the top, kth level includes two chips.

Figure 6:
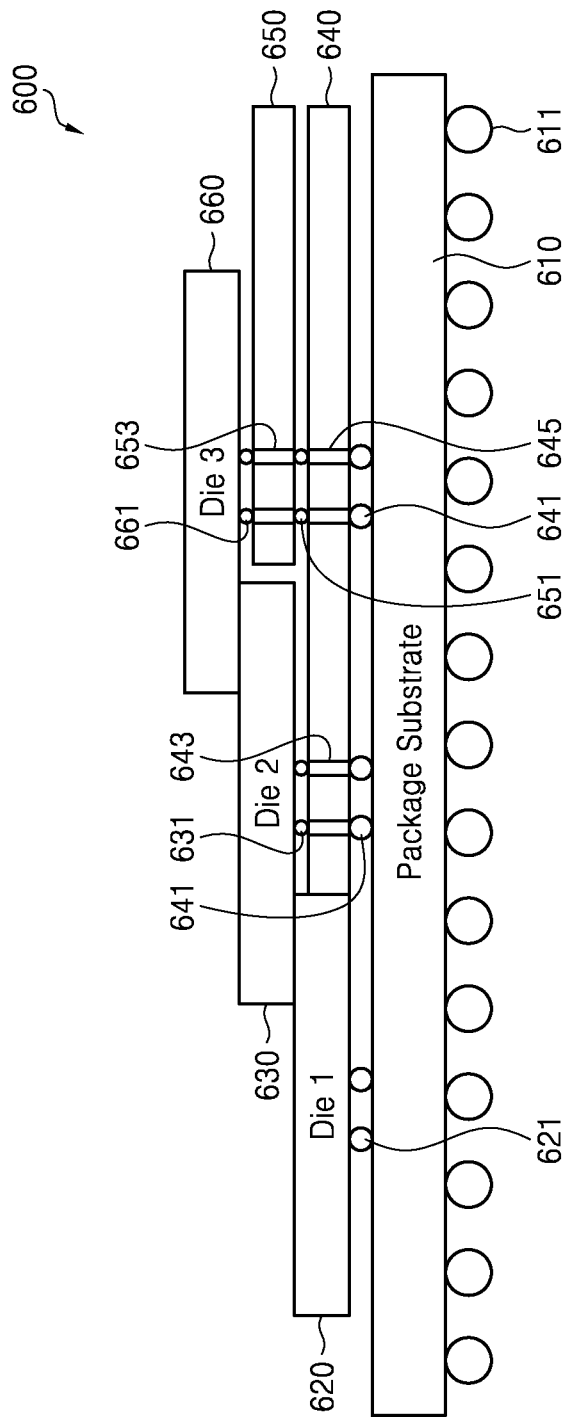
FIG. 6 is a cross-sectional view of a stacked die package according to yet other exemplary embodiments.

FIG. 6 is a cross-sectional view of a stacked die package 600 according to yet other exemplary embodiments. Referring to FIG. 6, the stacked die package 600 includes a package substrate 610, a plurality of dies 620, 630, and 660, and a plurality of interposers 640 and 650.

The first die 620 and the first interposer 640 are mounted on the package substrate 610. The second die 630 is mounted on the first die 620 and the first interposer 640.

The first interposer 640 includes first vertical electrical connection means 643 and second vertical electrical connection means 645. The first vertical electrical connection means 643 are used to electrically connect the second die 630 with the package substrate 610. The second interposer 650 is mounted on the first interposer 640. The second interposer 650 includes third vertical electrical connection means 653.

The third die 660 is mounted on the second die 630 and the second interposer 650. The second vertical electrical connection means 645 and the third vertical electrical connection means 653 are used to electrically connect the third die 660 with the package substrate 610.

The functions of the elements 610, 611, 620, 621, 630, 631, 640, 641, 643, 645, 650, 651, 653, 660, and 661 of the stacked die package 600 are similar to those of the elements 110, 111, 120, 121, 130, 131, 140, 141, and 143 of the stacked die package 100 illustrated in FIG. 1. Thus, detailed descriptions thereof will be omitted.

Figure 7:
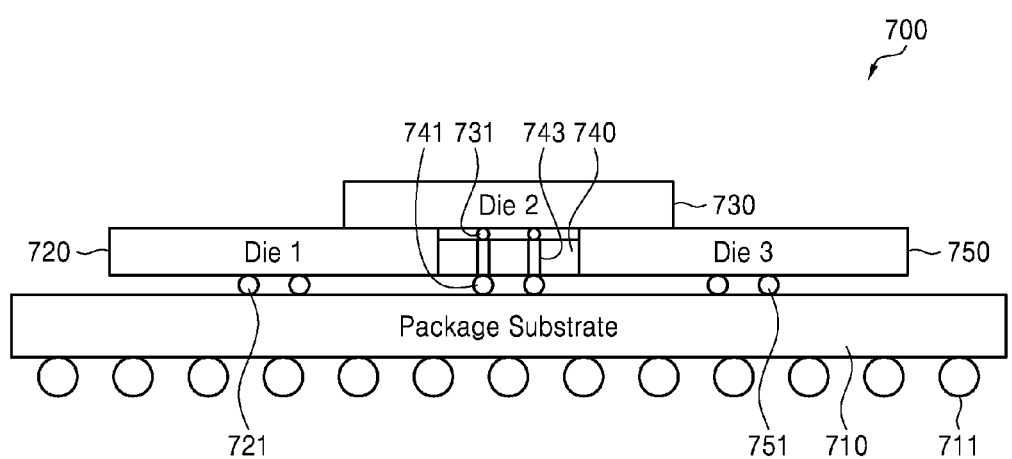
FIG. 7 is a cross-sectional view of a stacked die package according to still other exemplary embodiments.
Figure 8:
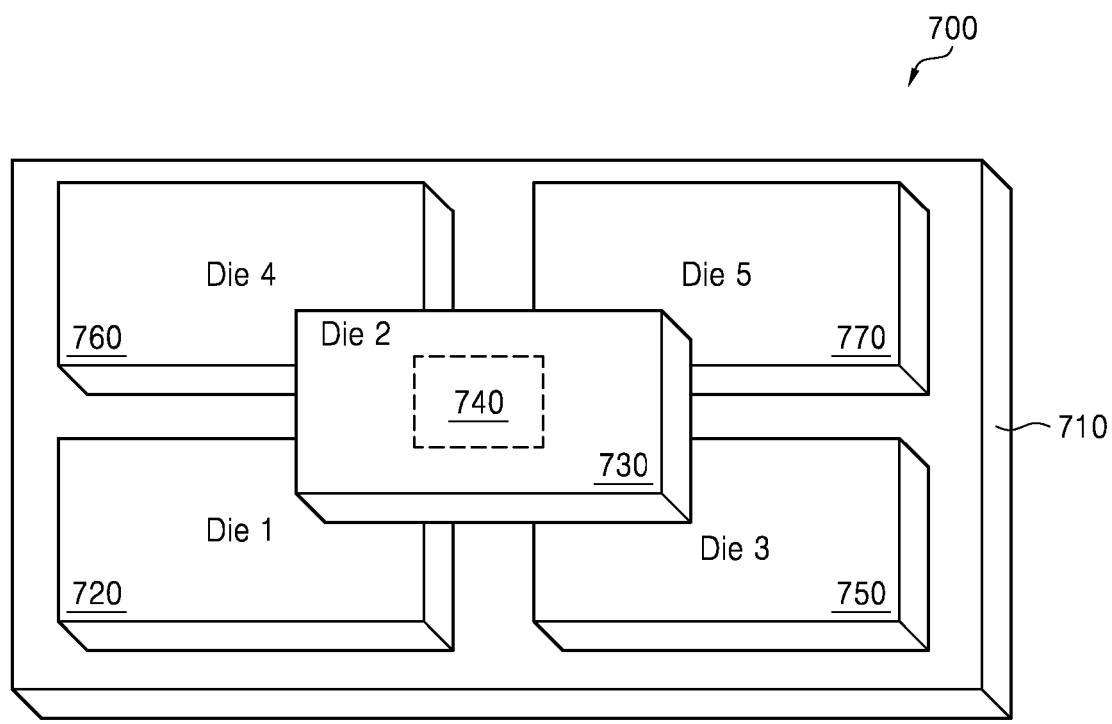
FIG. 8 is an exemplary top view of the stacked die package illustrated in FIG. 7.

FIG. 7 is a cross-sectional view of a stacked die package 700 according to still other exemplary embodiments. FIG. 8 is an exemplary top view of the stacked die package 700 illustrated in FIG. 7.

Referring to FIGS. 7 and 8, the stacked die package 700 includes a package substrate 710, a plurality of dies 720, 730, 750, 760, and 770, and an interposer 740. The stacked die package 700 may also include at least one more interposer in other embodiments.

The dies 720, 750, 760, and 770 and the interposer 740 are mounted on the package substrate 710. The interposer 740 includes vertical electrical connection means 743 to electrically connect the second die 730 with the package substrate 710. The functions of the elements 710, 711, 720, 721, 730, 731, 740, 741, 743, 750, and 751 of the stacked die package 700 are similar to those of the elements 110, 111, 120, 121, 130, 131, 140, 141, and 143 of the stacked die package 100 illustrated in FIG. 1. Thus, detailed descriptions thereof will be omitted.

Figure 9:
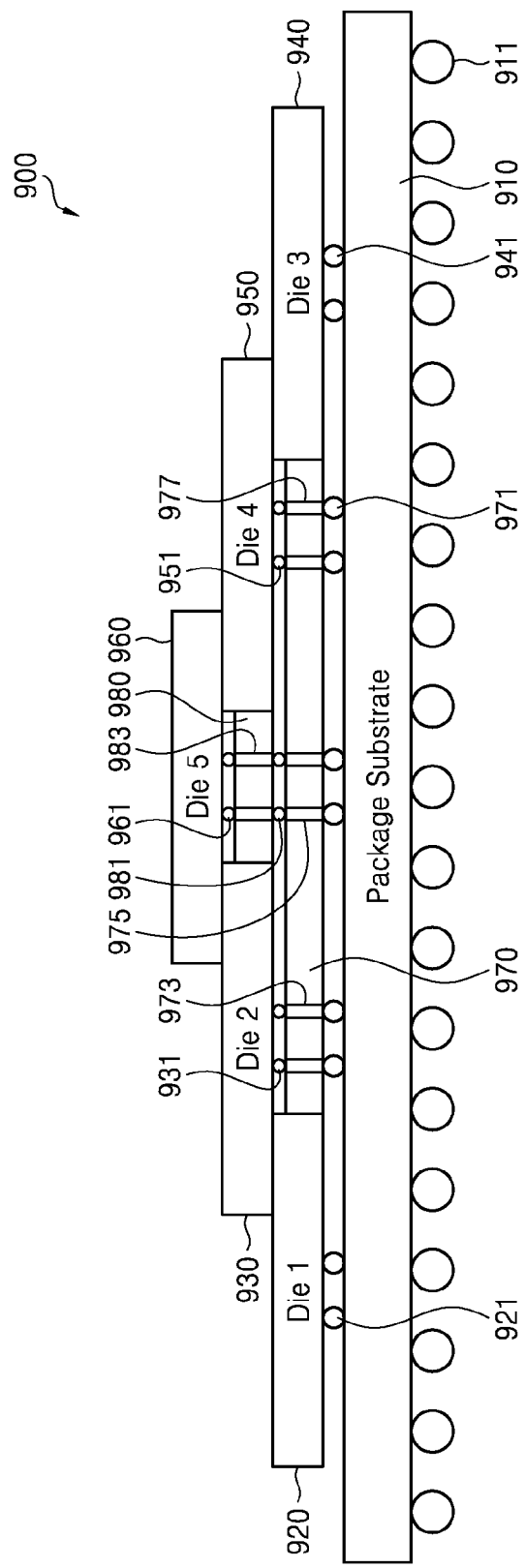
FIG. 9 is a cross-sectional view of a stacked die package according to further exemplary embodiments.
Figure 10:
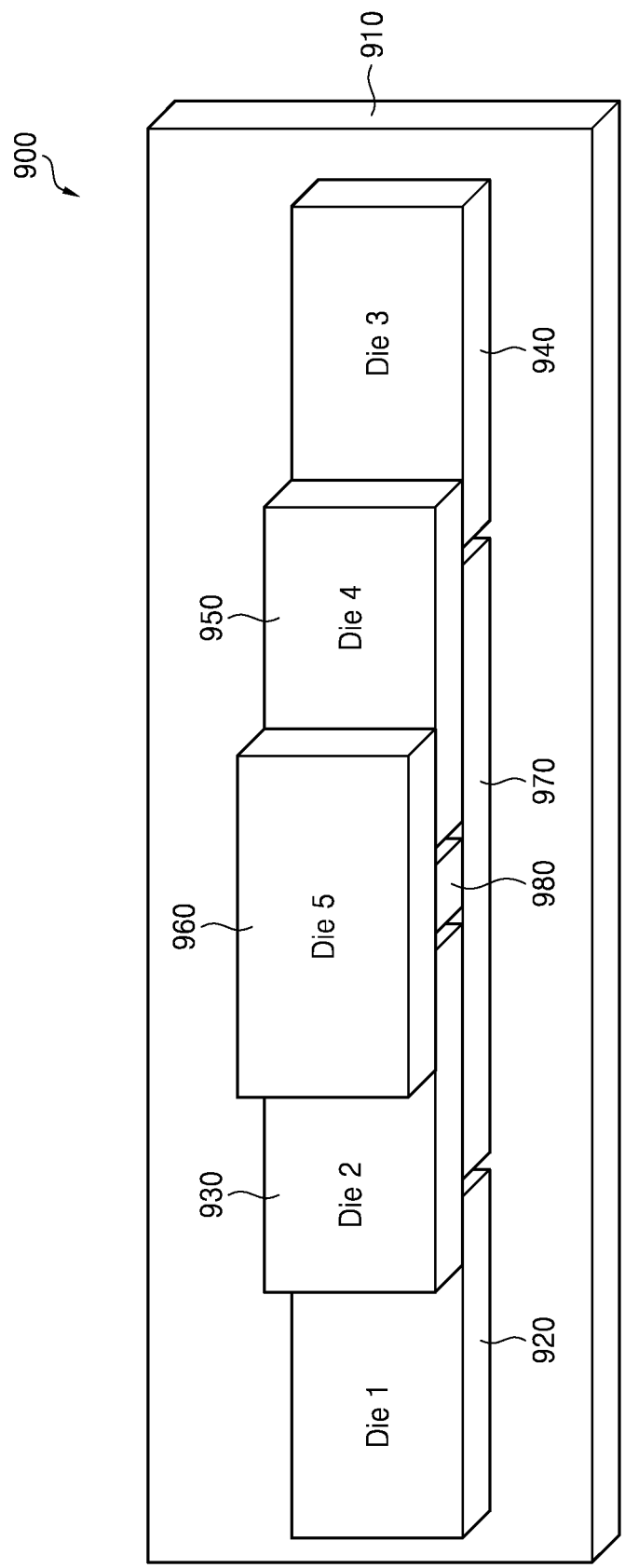
FIG. 10 is a top view of the stacked die package illustrated in FIG. 9.

FIG. 9 is a cross-sectional view of a stacked die package 900 according to further exemplary embodiments. FIG. 10 is an exemplary top view of the stacked die package 900 illustrated in FIG. 9.

Referring to FIGS. 9 and 10, the stacked die package 900 includes a package substrate 910, a plurality of dies 920, 930, 940, 950, and 960, and a plurality of interposers 970 and 980.

The dies 920 and 940 and the first interposer 970 are mounted on the package substrate 910. The second die 930 is mounted on the first die 920 and the first interposer 970. The second interposer 980 is mounted on the first interposer 970. The fourth die 950 is mounted on the first interposer 970 and the third die 940.

The first interposer 970 includes first vertical electrical connection means 973, second vertical electrical connection means 975, and third vertical electrical connection means 977. The first vertical electrical connection means 973 are used to electrically connect the package substrate 910 with the second die 930. The third vertical electrical connection means 977 are used to electrically connect the package substrate 910 with the fourth die 950.

The fifth die 960 is mounted on the second die 930, the second interposer 980, and the fourth die 950. The second interposer 980 includes fourth vertical electrical connection means 983. The second vertical electrical connection means 975 and the fourth vertical electrical connection means 983 are used to electrically connect the package substrate 910 with the fifth die 960.

The functions of the elements 910, 911, 920, 921, 930, 931, 940, 941, 950, 951, 960, 961, 970, 971, 973, 975, 977, 980, 981, and 983 of the stacked die package 900 are similar to those of the elements 110, 111, 120, 121, 130, 131, 140, 141, and 143 of the stacked die package 100 illustrated in FIG. 1. Thus, detailed descriptions thereof will be omitted.

Figure 11:
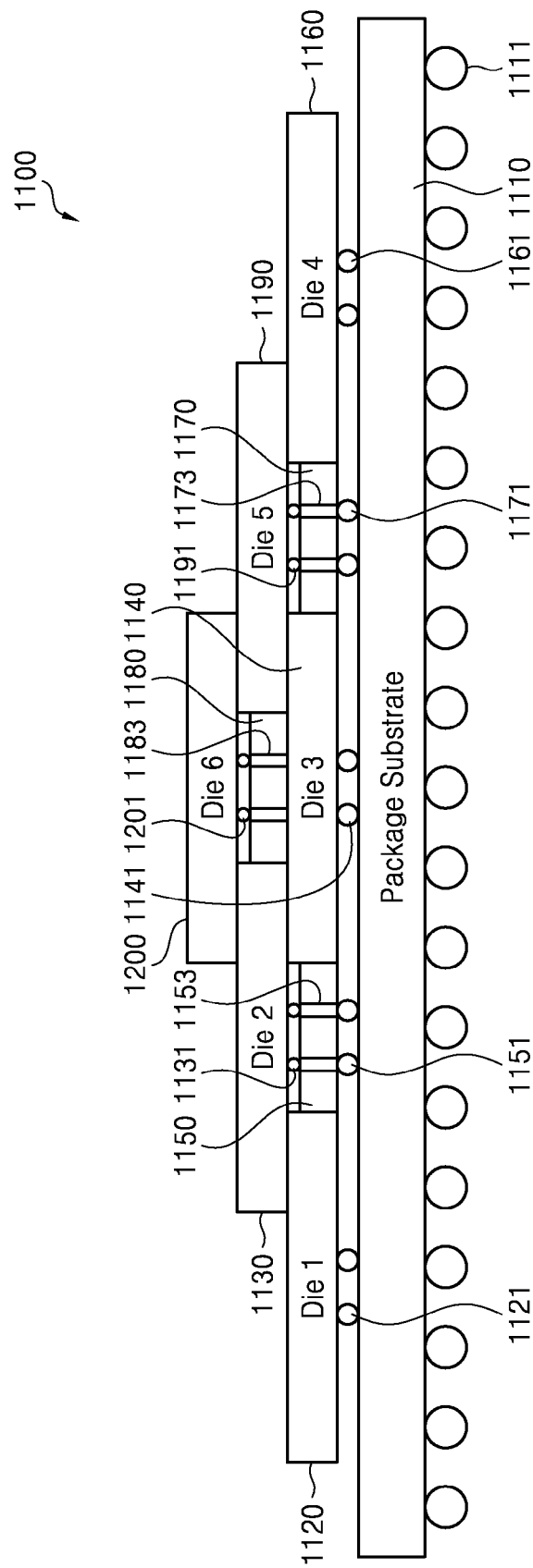
FIG. 11 is a cross-sectional view of a stacked die package according to other exemplary embodiments.
Figure 12:
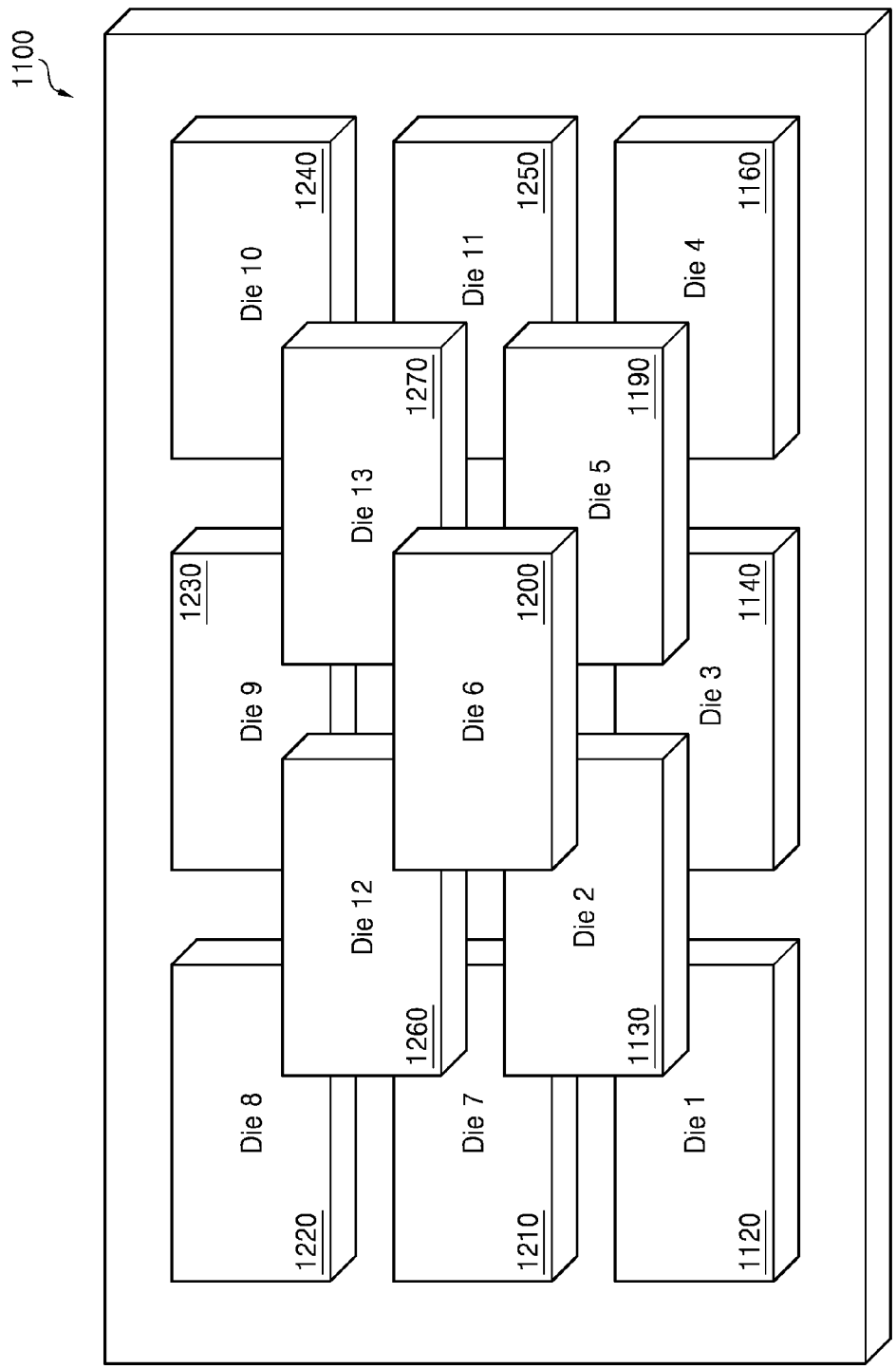
FIG. 12 is an exemplary top view of the stacked die package illustrated in FIG. 11.

FIG. 11 is a cross-sectional view of a stacked die package 1100 according to other exemplary embodiments. FIG. 12 is an exemplary top view of the stacked die package 1100 illustrated in FIG. 11.

Referring to FIGS. 11 and 12, the stacked die package 1100 includes a plurality of dies 1120, 1130, 1140, 1160, 1190, and 1200, and a plurality of interposers 1150, 1170, and 1180.

The dies 1120, 1140, and 1160 and the interposers 1150 and 1170 are mounted on the package substrate 1110. The first interposer 1150 includes vertical electrical connection means 1153. The vertical electrical connection means 1153 are used to electrically connect the package substrate 1110 with the second die 1130. The second interposer 1170 includes vertical electrical connection means 1173. The vertical electrical connection means 1173 are used to electrically connect the package substrate 1110 with the fifth die 1190.

The second die 1130 is mounted on the first die 1120, the first interposer 1150, and the third die 1140. The third interposer 1180 is mounted on the third die 1140. The third interposer 1180 includes vertical electrical connection means 1183. The vertical electrical connection means 1183 are used to electrically connect the sixth die 1200 with the third die 1140. The fifth die 1190 is mounted on the third die 1140, the second interposer 1170, and the fourth die 1160. The sixth die 1200 is mounted on the second die 1130, the third interposer 1180, and the fifth die 1190.

The functions of the elements 1110, 1111, 1120, 1121, 1130, 1131, 1140, 1141, 1150, 1151, 1153, 1160, 1161, 1170, 1171, 1173, 1180, 1183, 1190, 1191, and 1200 of the stacked die package 1100 are similar to those of the elements 110, 111, 120, 121, 130, 131, 140, 141, and 143 of the stacked die package 100 illustrated in FIG. 1. Thus, detailed descriptions thereof will be omitted.

Figure 13:
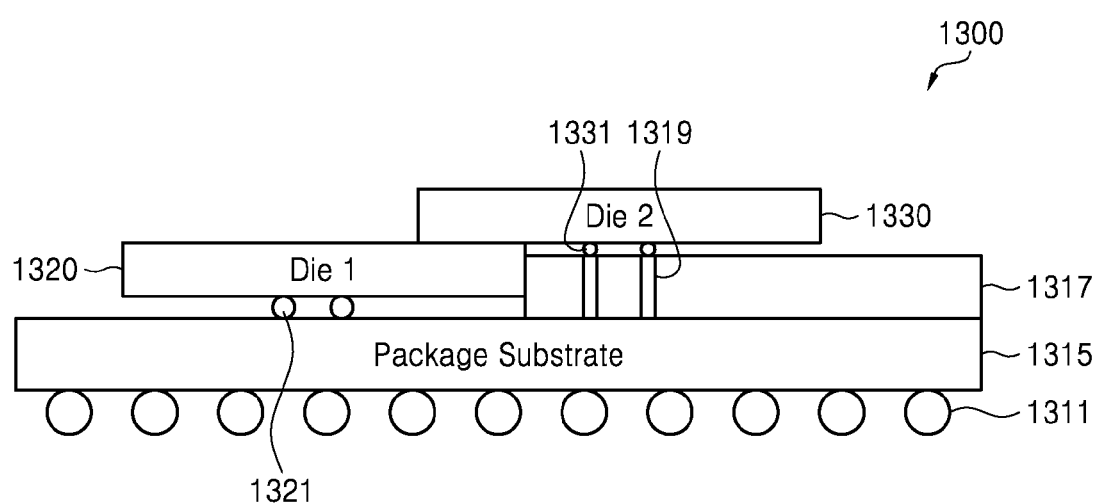
FIG. 13 is a cross-sectional view of a stacked die package according to yet other exemplary embodiments.
Figure 14:
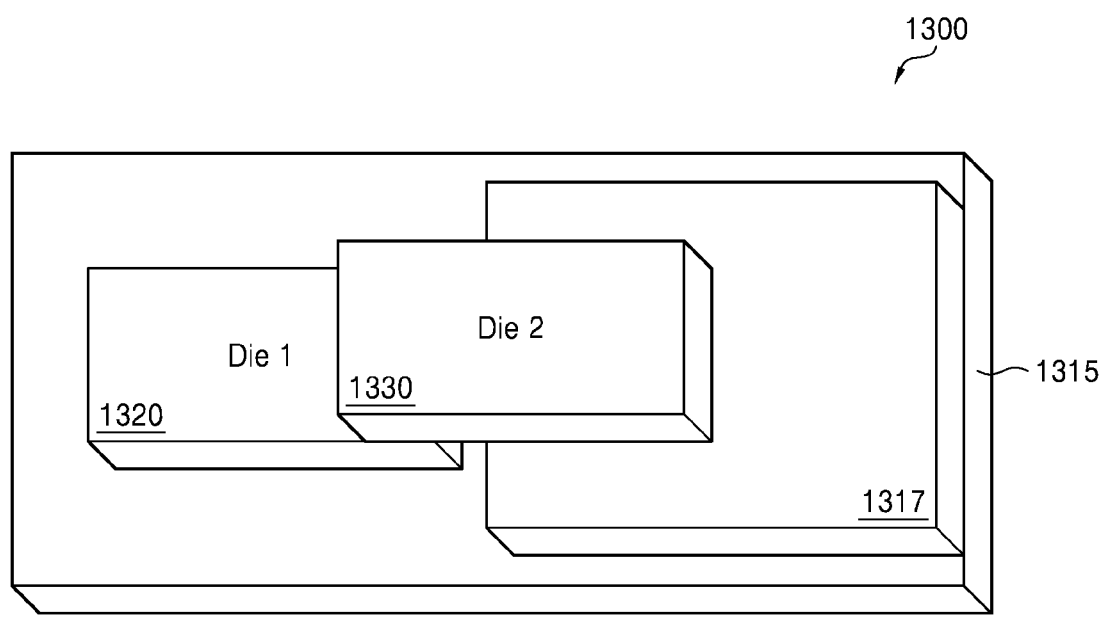
FIG. 14 is an exemplary top view of the stacked die package illustrated in FIG. 13.

FIG. 13 is a cross-sectional view of a stacked die package 1300 according to yet other exemplary embodiments. FIG. 14 is an exemplary top view of the stacked die package 1300 illustrated in FIG. 13.

Referring to FIGS. 13 and 14, the stacked die package 1300 includes a package substrate 1315, an interposer 1317, and a plurality of dies 1320 and 1330.

The first die 1320 is mounted on the package substrate 1315. The package substrate 1315 and the interposer 1317 may be implemented together in a single PCB in other embodiments. The interposer 1317 may be referred to as a step PCB. The second die 1330 is mounted on the first die 1320 and the interposer 1317. The interposer 1317 includes vertical electrical connection means 1319 to electrically connect the package substrate 1315 with the second die 1330.

The functions of the elements 1311, 1315, 1317, 1320, 1321, 1330, and 1331 of the stacked die package 1300 are similar to those of the elements 110, 111, 120, 121, 130, 131, 140, 141, and 143 of the stacked die package 100 illustrated in FIG. 1. Thus, detailed descriptions thereof will be omitted.

Figure 15:
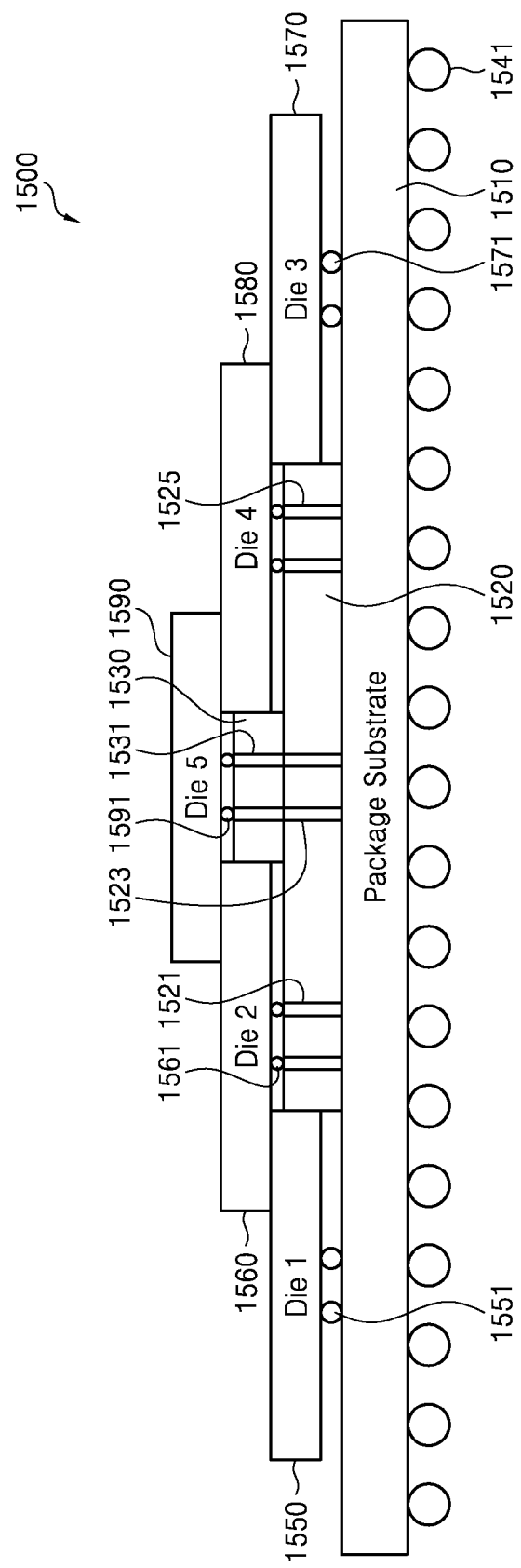
FIG. 15 is a cross-sectional view of a stacked die package according to still other exemplary embodiments.
Figure 16:
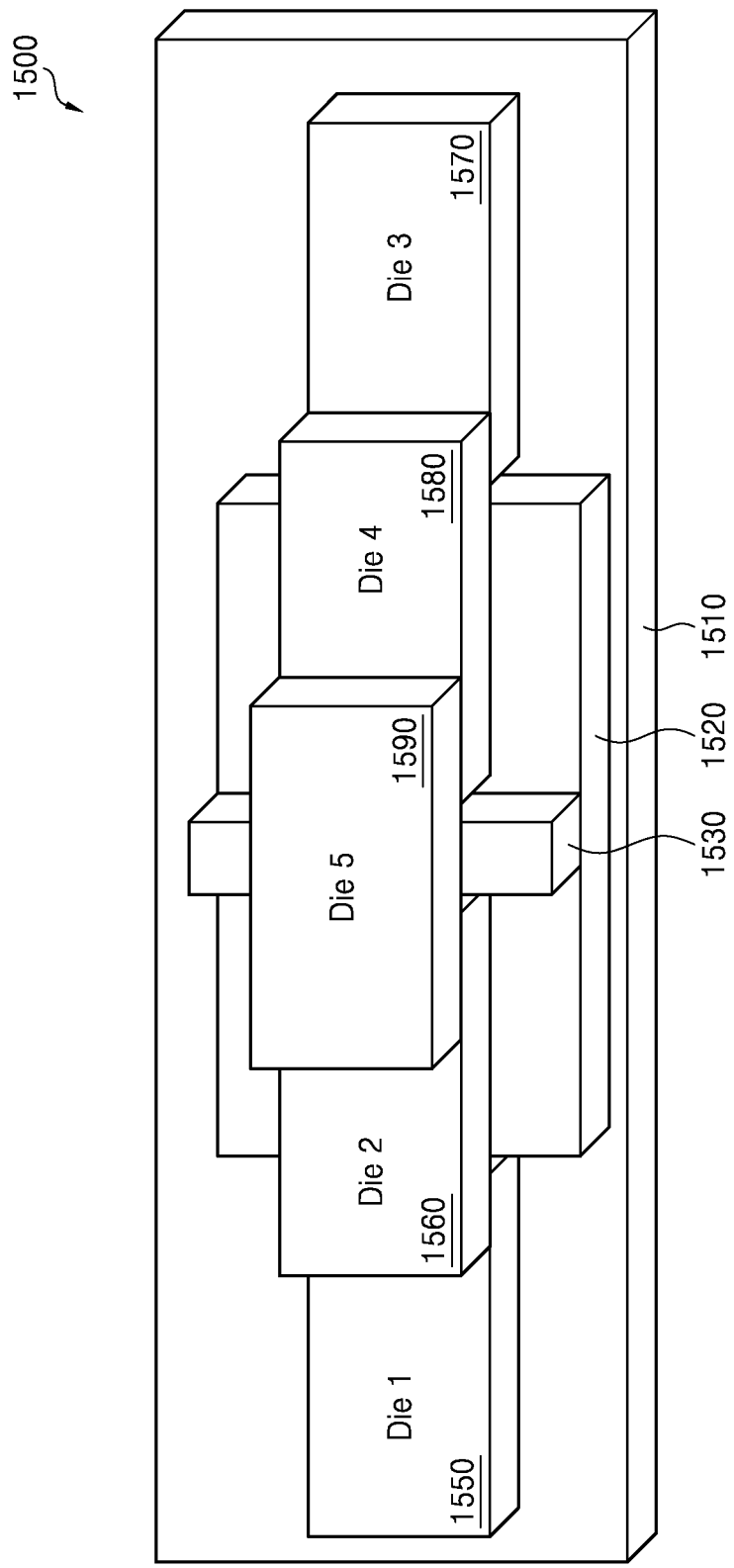
FIG. 16 is an exemplary top view of the stacked die package illustrated in FIG. 15.

FIG. 15 is a cross-sectional view of a stacked die package 1500 according to still other exemplary embodiments. FIG. 16 is an exemplary top view of the stacked die package 1500 illustrated in FIG. 15.

Referring to FIGS. 15 and 16, the stacked die package 1500 includes a package substrate 1510, a plurality of interposers 1520 and 1530, and a plurality of dies 1550, 1560, 1570, 1580, and 1590.

The dies 1550 and 1570 and the first interposer 1520 are mounted on the package substrate 1510. The second die 1560 is mounted on the first die 1550 and the first interposer 1520. The second interposer 1530 is mounted on the first interposer 1520. The fourth die 1580 is mounted on the first interposer 1520 and the third die 1570.

The first interposer 1520 includes first vertical electrical connection means 1521, second vertical electrical connection means 1523, and third vertical electrical connection means 1525. The first vertical electrical connection means 1521 are used to electrically connect the package substrate 1510 with the second die 1560. The third vertical electrical connection means 1525 are used to electrically connect the package substrate 1510 with the fourth die 1580.

The fifth die 1590 is mounted on the second die 1560, the second interposer 1530, and the fourth die 1580. The second interposer 1530 includes fourth vertical electrical connection means 1531. The second vertical electrical connection means 1523 and the fourth vertical electrical connection means 1531 are used to electrically connect the package substrate 1510 with the fifth die 1590.

The package substrate 1510 and the interposers 1520 and 1530 may be implemented together in a single PCB. The interposers 1520 and 1530 each may be referred to as a step PCB. Also, as shown, the interposers 1520 and 1530 may have different sizes and dimensions.

Figure 17:
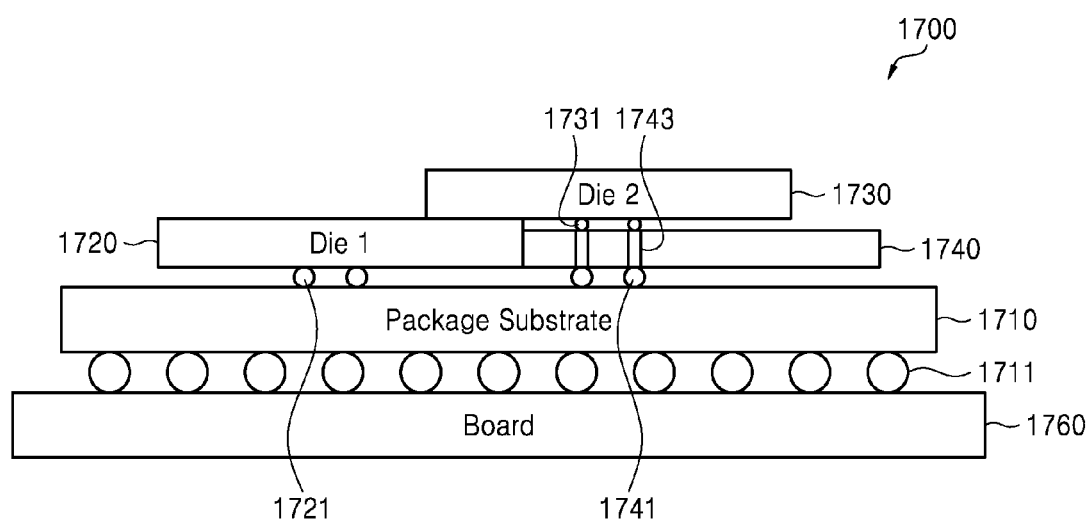
FIG. 17 is a cross-sectional view of a stacked die package according to further exemplary embodiments.

FIG. 17 is a cross-sectional view of a stacked die package 1700 according to further exemplary embodiments. Referring to FIG. 17, the stacked die package 1700 includes a package substrate 1710, a first die 1720, a second die 1730, an interposer 1740, and a board 1760. The stacked die package 1700 may be referred to as a chip-on-board package.

A plurality of solder balls 1711 are used as electrical contacts for the electrical connection with the board 1760. The electrical contacts may be implemented in a BGA.

The first die 1720 and the interposer 1740 are mounted on the package substrate 1710. The interposer 1740 includes vertical electrical connection means 1743 to electrically connect the package substrate 1710 with the second die 1730. The second die 1730 is mounted on the first die 1720 and the interposer 1740.

The functions of the elements 1710, 1711, 1720, 1721, 1730, 1731, 1740, 1741, and 1743 of the stacked die package 1700 are similar to those of the elements 110, 111, 120, 121, 130, 131, 140, 141, and 143 of the stacked die package 100 illustrated in FIG. 1. Thus, detailed descriptions thereof will be omitted.

Figure 18:
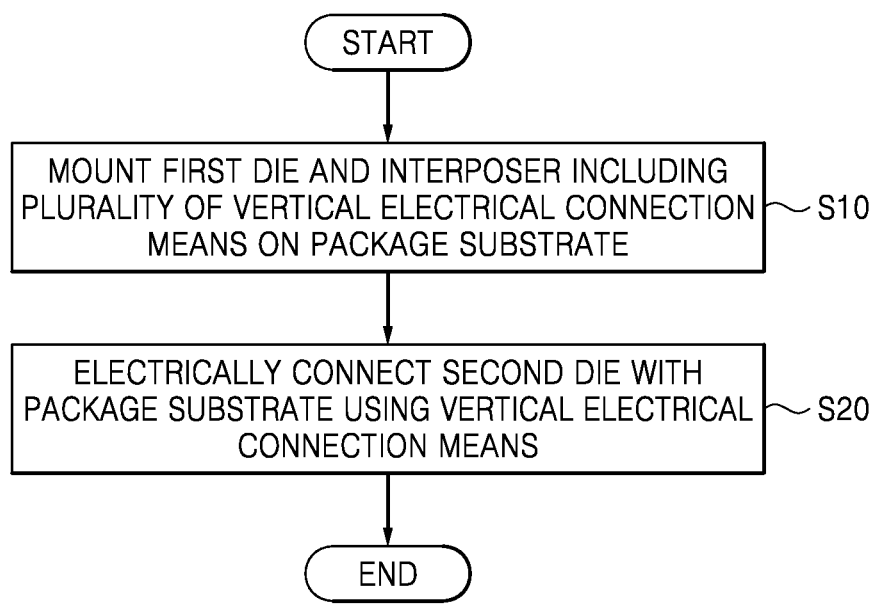
FIG. 18 is a flowchart of a method of manufacturing the stacked die package illustrated in FIG. 1 according to some exemplary embodiments.

FIG. 18 is a flowchart of a method of manufacturing the stacked die package 100 illustrated in FIG. 1 according to some exemplary embodiments. Referring to FIGS. 1 and 18, the first die 120 and the interposer 140 including the vertical electrical connection means 143 are mounted on the package substrate 110 in operation S10.

The second die 130 is electrically connected with the package substrate 110 using the vertical electrical connection means 143 in operation S20. The interposer 140 is disposed between the package substrate 110 and the second die 130 to be adjacent to the first die 120. Each of the first and second dies 120 and 130 is a flip chip. Each of the vertical electrical connection means 143 is a TSV.

For convenience' sake in the description, the method of manufacturing the stacked die package 100 illustrated in FIG. 1 has been described, but the stacked die packages illustrated in FIGS. 3 through 17 may also be manufactured using a method similar to the method illustrated in FIG. 18.

Figure 19:
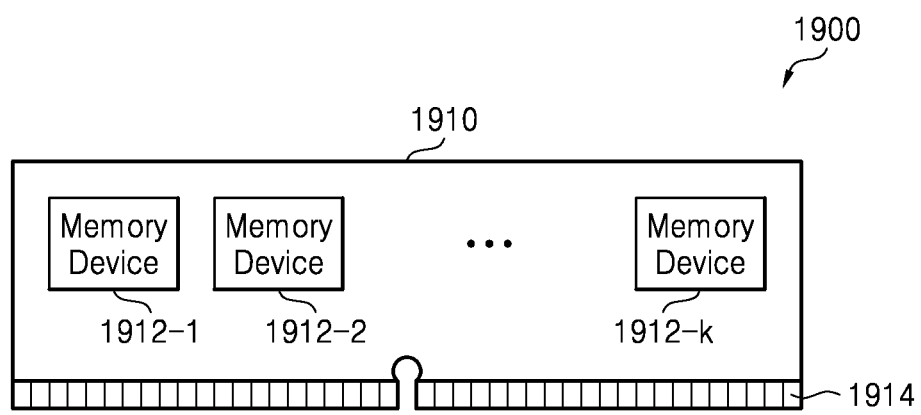
FIG. 19 is a diagram of a system including any one of the stacked die packages illustrated in FIGS. 1 through 17 according to some exemplary embodiments.

FIG. 19 is a diagram of a system 1900 including any one of the stacked die packages illustrated in FIGS. 1 through 17 according to some exemplary embodiments. Referring to FIG. 19, the system 1900 may be a memory module and may include a plurality of memory devices 1912-1 through 1912-$k$ mounted on a PCB 1910 where "k" is a natural number. The PCB 1910 includes a plurality of connection pins 1914. Each of the memory devices 1912-1 through 1912-$k$ may be any one of the stacked die packages illustrated in FIGS. 1 through 17.

The memory module 1900 may be, for example, a single in-line memory module (SIMM), a dual in-line memory module (DIMM), a load reduction DIMM (LRDIMM), a fully buffered DIMM (FBDIMM), an unregistered DIMM (UDIMM), a registered DIMM (RDIMM), or a small outline DIMM (SO-DIMM).

Figure 20:
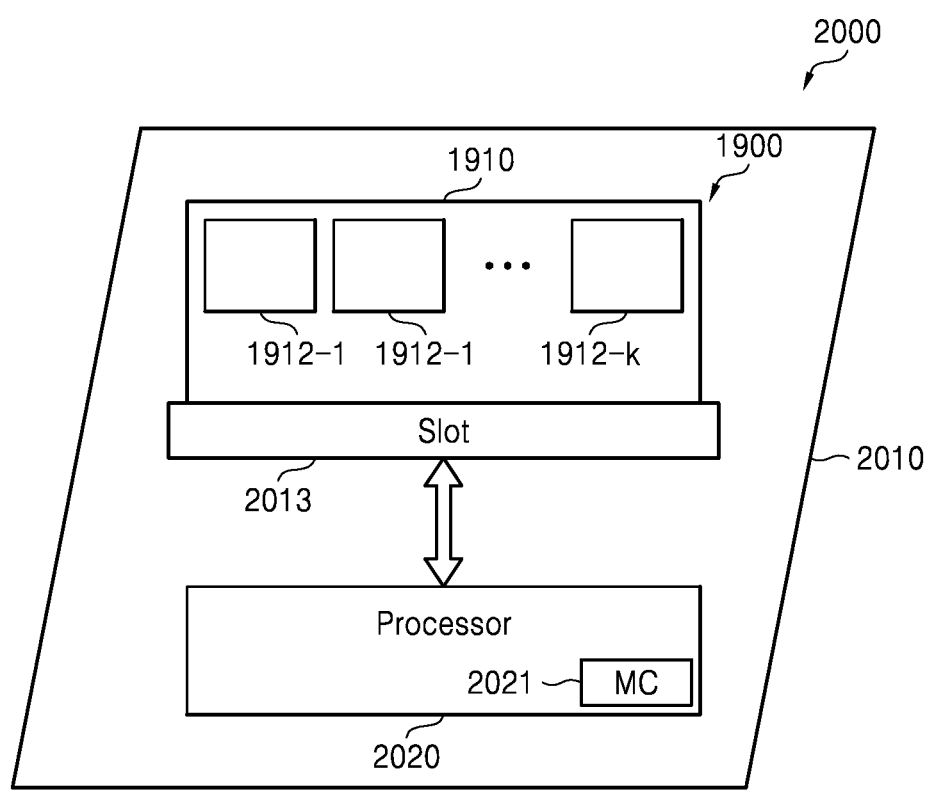
FIG. 20 is a diagram of a system including any one of the stacked die packages illustrated in FIGS. 1 through 17 according to other exemplary embodiments.

FIG. 20 is a diagram of a system 2000 including any one of the stacked die packages illustrated in FIGS. 1 through 17 according to other exemplary embodiments. Referring to FIG. 20, the system 2000 may be implemented, for example, as a personal computer (PC), a laptop computer, or a server.

The system 2000 includes a memory module slot 2013 and a processor 2020, which are mounted on a main board 2010. The memory devices 1912-1 through 1912-$k$ in the memory module 1900 may transmit and receive data to and from the processor 2020 through the memory module slot 2013 and the main board 2010.

Each of the memory devices 1912-1 through 1912-$k$ may be any one of the stacked die packages illustrated in FIGS. 1 through 17. The processor 2020 may be, for example, a chip set. The processor 2020 may include a memory controller 2021 to control the memory devices 1912-1 through 1912-$k$.

Figure 21:
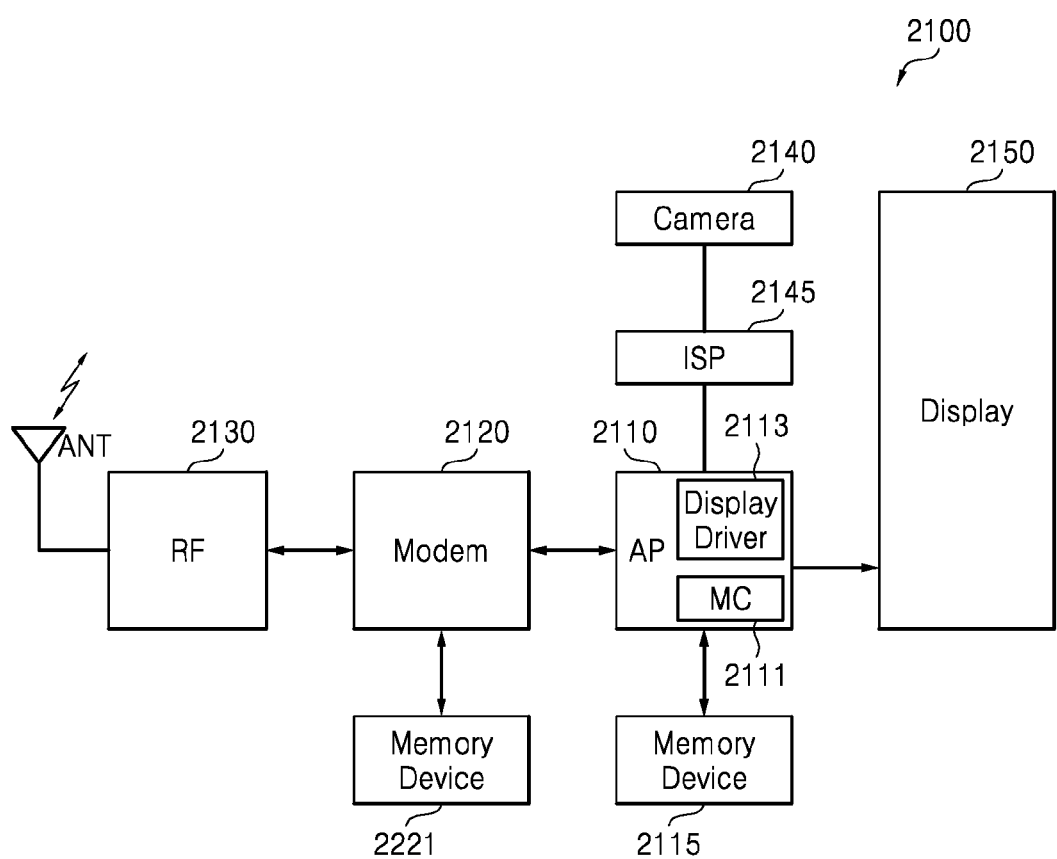
FIG. 21 is a diagram of a system including any one of the stacked die packages illustrated in FIGS. 1 through 17 according to further exemplary embodiments.

FIG. 21 is a diagram of a system 2100 including any one of the stacked die packages illustrated in FIGS. 1 through 17 according to further exemplary embodiments. Referring to FIG. 21, the system 2100 may be implemented, for example, as a mobile computing device. The mobile computing device may be, for example, a laptop computer, a mobile telephone, a smart phone, a tablet PC, a personal digital assistant (PDA), an enterprise digital assistant (EDA), a digital still camera, a portable multimedia player (PMP), a personal navigation device or portable navigation device (PND), a handheld game console, a mobile internet device (MID), or an e-book.

An application processor (AP), e.g., a mobile AP, 2110 may control the operation of elements 2115, 2120, 2145, and 2150. Each of the memory devices 2115 and 2221 may be any one of the stacked die packages illustrated in FIGS. 1 through 17.

A memory controller 2111 implemented within the AP 2110 may control an access operation to the memory device 2115. A display driver 2113 implemented within the AP 2110 may control the operation of the display 2150. The display 2150 may be implemented by a thin film transistor liquid crystal display (TFT-LCD), a light-emitting diode (LED) display, an organic LED (OLED) display, an active-matrix OLED (AMOLED) display, or a flexible display.

The modem 2120 may interface data between a radio frequency (RF) transceiver 2130 and the AP 2110. Data processed by the modem 2120 may be stored in the memory device 2221 or transmitted to the AP 2110.

RF data received through an antenna ANT is transmitted to the modem 2120 through the RF transceiver 2130. Data output from the modem 2120 is converted into RF data by the RF transceiver 2130 and then output through the antennal ANT.

The image signal processor (ISP) 2145 may process a signal output from a camera or an image sensor 2140 and the processed data may be transmitted to the AP 2110. The AP 2110 may control at least one of web browsing, e-mail access, video playback, document editing, and image editing.

Figure 22:
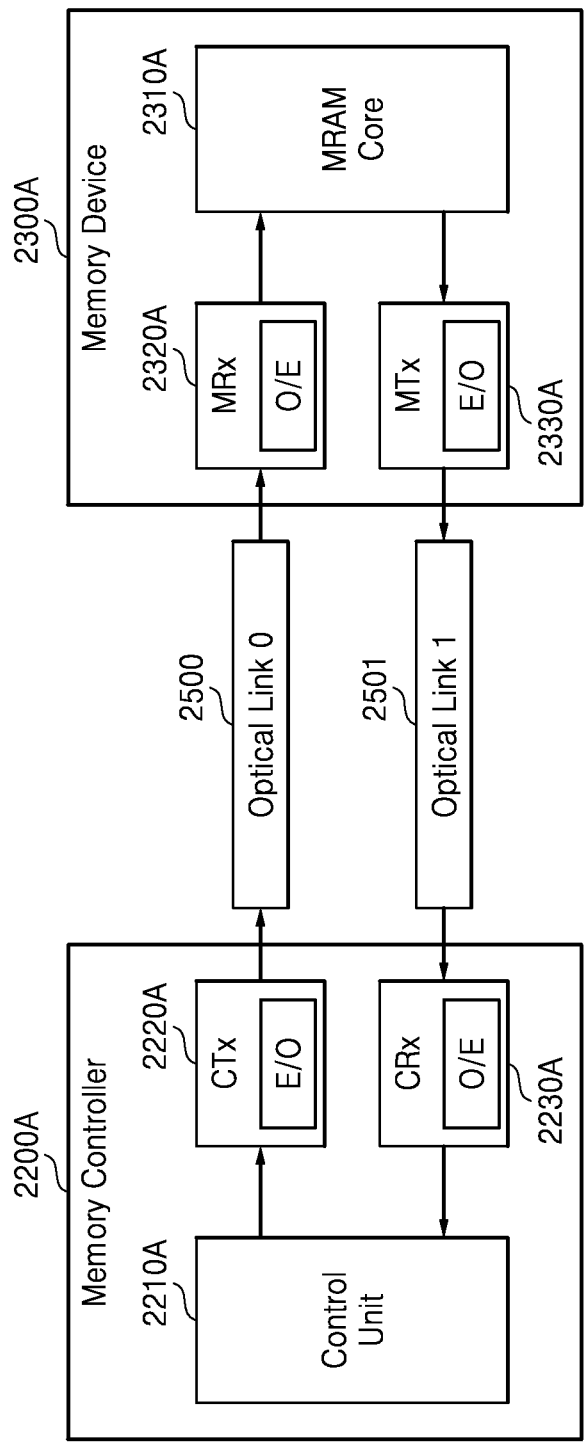
FIG. 22 is a diagram of a system including any one of the stacked die packages illustrated in FIGS. 1 through 17 according to other exemplary embodiments.

FIG. 22 is a diagram of a system including any one of the stacked die packages illustrated in FIGS. 1 through 17 according to other exemplary embodiments. Referring to FIG. 22, the system includes a memory controller 2200A and a memory device 2300A.

The memory controller 2200A includes a control unit 2210A, an optical transmitter 2220A including an electrical-to-optical (E/O) converter converting an electrical signal into an optical signal, and an optical receiver 2230A including an optical-to-electrical (O/E) converter converting an optical signal into an electrical signal. The memory device 2300A includes an MRAM core 2310A, an optical receiver 2320A including an O/E converter converting an optical signal into an electrical signal, and an optical transmitter 2330A including an E/O converter converting an electrical signal into an optical signal. The memory device 2300A is a die included in any one of the stacked die packages illustrated in FIGS. 1 through 17.

Optical links 2500 and 2501 are connected between the memory controller 2200A and the memory device 2300A for data transmission. Alternatively, the memory controller 2200A and the memory device 2300A may transmit and receive data to and from each other through only one optical link.

Though not shown in the various figures, a typical hermetically packaged device including a plurality of stacked chips is encapsulated with a resin or other encapsulation structure to hermetically seal the various stacked chips and protect them from the external environment. Therefore, in certain embodiments, the disclosed chip stack packages are hermetically sealed with an encapsulant that covers the stack of chips.

As described above, according to some embodiments, vertical electrical connection means included in an interposer are used to stack a plurality of dies in a stacked die package, so that die packaging cost is reduced. A resulting package may avoid the need to include through silicon vias (TSVs) in chips included in chip stack package, while also avoiding the need to use wire bonding between the chips and a package substrate.

What is claimed is:
1. A stacked chip package, comprising:
a package substrate;

at least a first chip stacked on the package substrate at a first height above the package substrate and electrically connected to the package substrate; and at least a second chip stacked on the package substrate at a second height above the first height and electrically connected to the package substrate, part of the second chip overlapping part of the first chip in a vertical direction and part of the second chip not overlapping the first chip in the vertical direction; wherein:

both the first chip and the second chip are flip chips electrically connected to the package substrate using a flip chip configuration, the first chip is electrically connected to the package substrate using a direct flip chip connection, and the second chip is electrically connected to the package substrate using a flip chip connection to an interposer disposed between the second chip and the package substrate.

2. The stacked chip package of claim 1, wherein:
the interposer includes a plurality of vertical electrical connection means electrically connecting the second chip to the package substrate.

3. The stacked chip package of claim 1, further comprising:
at least a third chip stacked on the package substrate at the first height and horizontally separate from the first chip, wherein part of the second chip overlaps part of the third chip in a vertical direction and part of the second chip does not overlap the third chip in the vertical direction.

4. The stacked chip package of claim 3, wherein:
each of the first chip and third chip is a flip chip electrically connected to the package substrate using a flip chip configuration.

5. The stacked chip package of claim 3, wherein:
each of the first chip and the third chip is directly electrically connected to the package substrate; and
the second chip is electrically connected to the package substrate through an interposer.

6. The stacked chip package of claim 1, wherein:
the stacked chips on the package substrate include:
k levels of chips, each level including one or more chips disposed at a same height above the package substrate, wherein k is an integer being 2 or more;
n chips disposed at a first level corresponding to the first height, wherein n is an integer being 3 or more; and
m chips disposed at a second level corresponding to the second height wherein m is an integer greater than 0 and less than n.

7. The stacked chip package of claim 6, wherein:
p chips are disposed at the kth level of chips, p being less than n;
a vertical height between a bottom of the n chips disposed at the first level and a top of the p chips disposed at the kth level is less than a cumulative vertical height of each of the chips of the stacked chips combined.

8. The stacked chip package of claim 7, wherein:
the vertical height between the bottom of the n chips disposed at the first level and a top of the p chips disposed at the kth level is less than ⅔ the cumulative vertical height of each of the chips of the stacked chips combined.

9. The stacked chip package of claim 1, wherein:
one of the first chip and the second chip is a memory chip, and the other of the first chip and the second chip is a memory chip or a memory controller.

10. A stacked chip package, comprising:
a package substrate;
at least a first chip stacked on the package substrate at a first height above the package substrate and electrically connected to the package substrate;
at least a second chip stacked on the package substrate at the first height and electrically connected to the package substrate;
at least a third chip stacked on the package substrate at a second height above the first height and electrically connected to the package substrate, part of the third chip overlapping part of the first chip in a vertical direction, part of the third chip overlapping part of the second chip in a vertical direction, and part of the third chip not overlapping the first chip or the second chip in the vertical direction; and
an interposer disposed between the package substrate and the third chip.

11. The stacked chip package of claim 10, wherein:
the first chip is directly electrically connected to the package substrate;
the second chip is directly electrically connected to the package substrate; and
the third chip is electrically connected to the package substrate through the interposer.

12. The stacked chip package of claim 11, wherein:
at least one of the first chip and the second chip is directly electrically connected to the package substrate in a flip chip configuration.

13. The stacked chip package of claim 10, wherein:
the stacked chips on the package substrate include:
k levels of chips, each level including one or more chips disposed at a same height above the package substrate, wherein k is an integer being 2 or more;
n chips disposed at a first level corresponding to the first height, wherein n is an integer being 3 or more; and
m chips disposed at a second level corresponding to the second height wherein m is an integer greater than 0 and less than n.

14. The stacked chip package of claim 13, wherein:
p chips are disposed at the kth level of chips; and
a vertical height between a bottom of the n chips disposed at the first level and a top of the p chips disposed at the kth level is less than ⅔ the cumulative vertical height of each of the chips of the stacked chips combined.

15. The stacked chip package of claim 13, wherein:
the vertical height between the bottom of the n chips disposed at the first level and a top of the p chips disposed at the kth level is less than ½ the cumulative vertical height of each of the chips of the stacked chips combined.

* * * * *